US010250080B2

(12) United States Patent
Murakami et al.

(10) Patent No.: US 10,250,080 B2
(45) Date of Patent: *Apr. 2, 2019

(54) DETECTOR, POWER TRANSMITTER, POWER RECEIVER, POWER FEED SYSTEM, AND DETECTION METHOD

(71) Applicant: Sony Corporation, Tokyo (JP)

(72) Inventors: Tomomichi Murakami, Tokyo (JP); Yoshitaka Yoshino, Tokyo (JP)

(73) Assignee: Sony Corporation, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/087,542

(22) Filed: Mar. 31, 2016

(65) Prior Publication Data
US 2016/0261149 A1 Sep. 8, 2016

Related U.S. Application Data

(63) Continuation of application No. 14/005,930, filed as application No. PCT/JP2012/055959 on Mar. 8, 2012.

(30) Foreign Application Priority Data

Mar. 13, 2011 (JP) ................................ 2011-081018

(51) Int. Cl.
H01F 27/42 (2006.01)
H01F 37/00 (2006.01)
(Continued)

(52) U.S. Cl.
CPC .......... *H02J 50/60* (2016.02); *G01R 27/2611* (2013.01); *G01V 3/10* (2013.01);
(Continued)

(58) Field of Classification Search
CPC .. H02J 5/005; H02J 7/025; H02J 50/00; H02J 50/60; H02J 50/80; H01F 38/14; H04B 5/0037
See application file for complete search history.

(56) References Cited

U.S. PATENT DOCUMENTS 4,663,224 A 5/1987 Tabata et al.
2004/0056778 A1 3/2004 Hilliard
(Continued)

FOREIGN PATENT DOCUMENTS

CN 101533937 A 9/2009
CN 10-1873014 A 10/2010
(Continued)

OTHER PUBLICATIONS

Baskshi et al., Electronic measurments, First Edition, 2008.*
(Continued)

*Primary Examiner* — Rexford Barnie
*Assistant Examiner* — Rasem Mourad
(74) *Attorney, Agent, or Firm* — Michael Best & Friedrich LLP

(57) ABSTRACT

There are provided a detector and the like that are capable of conveniently detecting conductor or a circuit including a coil. The detector includes a detecting section that determines a Q value or a degree of variation thereof in a circuit including a coil capable of electromagnetic coupling with an external object and that performs detection concerning a state of the electromagnetic coupling with the external object based on a determined result.

21 Claims, 14 Drawing Sheets

(51) Int. Cl.

| | | |
|---|---|---|
| *H01F 38/00* | (2006.01) | |
| *H02J 50/60* | (2016.01) | |
| *H02J 7/02* | (2016.01) | |
| *H02J 50/40* | (2016.01) | |
| *H02J 5/00* | (2016.01) | |
| *G01R 27/26* | (2006.01) | |
| *H01F 38/14* | (2006.01) | |
| *G01V 3/10* | (2006.01) | |
| *H02J 50/80* | (2016.01) | |
| *H02J 50/12* | (2016.01) | |

(52) U.S. Cl.
   CPC .............. *H01F 38/14* (2013.01); *H02J 5/005* (2013.01); *H02J 7/025* (2013.01); *H02J 50/12* (2016.02); *H02J 50/40* (2016.02); *H02J 50/80* (2016.02)

(56) References Cited

U.S. PATENT DOCUMENTS

| | | | |
|---|---|---|---|
| 2009/0009006 A1* | 1/2009 | Jin | H02J 7/0011 307/104 |
| 2010/0066305 A1 | 3/2010 | Takahashi et al. | |
| 2010/0070219 A1* | 3/2010 | Azancot | H02J 5/005 702/62 |
| 2010/0073177 A1 | 3/2010 | Azancot et al. | |
| 2010/0084918 A1* | 4/2010 | Fells | H02J 5/005 307/32 |
| 2010/0244579 A1 | 9/2010 | Sogabe et al. | |
| 2010/0270867 A1* | 10/2010 | Abe | H02J 7/025 307/104 |
| 2010/0320962 A1* | 12/2010 | Sekita | H02J 7/025 320/108 |
| 2011/0074346 A1* | 3/2011 | Hall | B60L 3/00 320/108 |
| 2012/0001493 A1* | 1/2012 | Kudo | H02J 5/005 307/104 |
| 2013/0094598 A1 | 4/2013 | Bastami | |

FOREIGN PATENT DOCUMENTS

| | | | |
|---|---|---|---|
| JP | H11-144987 A | | 5/1999 |
| JP | 2004-206271 | | 7/2004 |
| JP | 2005-279318 A | | 10/2005 |
| JP | 2006-191525 A | | 7/2006 |
| JP | 2008-206297 A | | 9/2008 |
| JP | 2009-005426 A | | 1/2009 |
| JP | 2009005426 A | * | 1/2009 |
| JP | 2009-213295 A | | 9/2009 |
| JP | 2009-296857 A | | 12/2009 |
| JP | 2010-086119 | | 4/2010 |
| JP | 2010-216863 | | 9/2010 |
| JP | 2010-252498 A | | 11/2010 |
| JP | 2011-036125 A | | 2/2011 |
| WO | WO-2010/040015 A2 | | 4/2010 |

OTHER PUBLICATIONS

Japanese Office Action dated Mar. 8, 2016 for corresponding Japanese Application No. 2013-507327.
Chinese Office Action dated Nov. 3, 2015, for corresponding Chinese Application No. 2012800146680.
European Search Report corresponding to European Serial No. 12762995.4 dated Jun. 19, 2015.
Japanese Office Action dated May 31, 2016 for Japanese Application No. 2013-507327.
Chinese Office Action dated Dec. 13, 2016 for corresponding Chinese Application No. 20128001466801.
Japanese Office Action dated May 23, 2017 for corresponding Japanese Application No. 2016-161026.
Chinese Office Action dated Jun. 20, 2017 for corresponding Chinese Application No. 2012800146680.
Yang, Longlin "Electronic Measurement Technology" section 4.3 Measurement of resonance parameters: pp. 98-66, Post and Telecom Press, May 31, 2009.
Extended European Search Report dated Jun. 21, 2018 for corresponding European Application No. 18 173 184.5.
European Patent Office Communication Pursuant to Article 94 (3) EPC dated Jul. 24, 2018 for corresponding European Application No. 12 762 995.4.

* cited by examiner

[ FIG. 5 ]
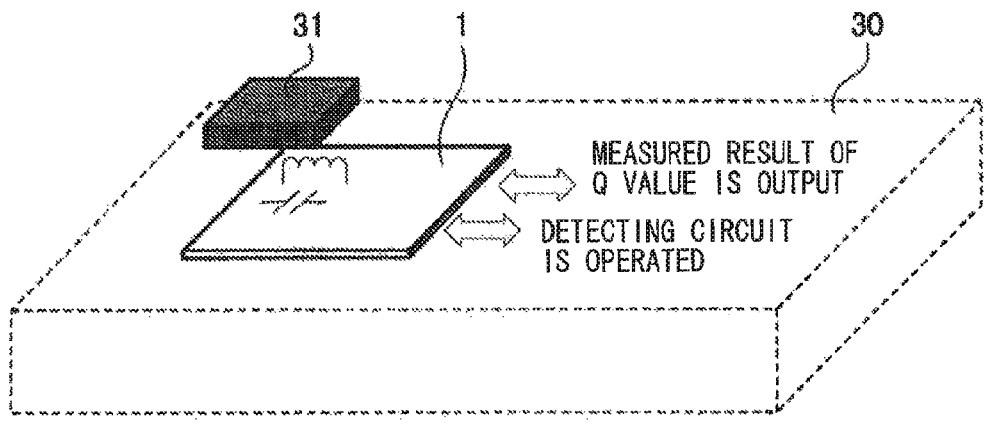

DETECTOR, POWER TRANSMITTER, POWER RECEIVER, POWER FEED SYSTEM, AND DETECTION METHOD

CROSS REFERENCE TO RELATED APPLICATIONS

The present application is a Continuation of application Ser. No. 14/005,930, filed Sep. 18, 2013, which is a National Stage Entry of PCT/JP2012/055959, filed Mar. 8, 2012, and claims the benefit of Japanese Priority Patent Application JP 2011-081018 filed Mar. 13, 2011, the entire contents of which are incorporated herein by reference.

TECHNICAL FIELD

The present disclosure relates to a detector and a detection method for detecting the presence of a conductor such as a metal, or a circuit including a coil, as well as a power transmitter, a power receiver, and a power feed system that are provided with such a detector (detecting section).

BACKGROUND ART

In a noncontact power transmission (noncontact power feed system), it is critically important in ensuring the safety and performing electrical charging to detect a conductor such as a metal, or a circuit including a coil that is present in the vicinity of power transmitting and receiving coils.

Typically, by combined use of a power transmitter and a power receiver, a metallic object that is inserted between the power transmitter (primary-side coil) and the power receiver (secondary-side coil) has been detected based on information on an amplitude and a phase in the event of variation in the load of the power receiver (for example, see Patent Literature 1). Alternatively, a metallic object has been detected from variation in the transmitting and receiving power efficiency (also called the inter-coil efficiency), or from variation in the sensor output by the use of a magnetic sensor, a capacitive sensor, an infrared sensor, or the like.

PRIOR ART DOCUMENT

Patent Literature

Patent Literature 1: Japanese Patent No. 4413236 (Japanese Unexamined Patent Application Publication No. 2008-206231)

SUMMARY OF INVENTION

Meanwhile, in such a noncontact power feed system, it is desirable to conveniently detect the above-described conductor (including a semiconductor) such as a metal, or the above-described circuit including a coil.

The present disclosure has been made in view of such disadvantages, and it is an object of the present disclosure to provide a detector, a power transmitter, a power receiver, a power feed system, and a detection method that are capable of conveniently detecting a conductor or a circuit including a coil.

A detector according to an embodiment of the present disclosure includes a detecting section that determines a Q value or a degree of variation thereof in a circuit including a coil capable of electromagnetic coupling with an external object and that performs detection concerning a state of the electromagnetic coupling with the external object based on a determined result.

A power transmitter according to an embodiment of the present disclosure includes: a power transmitting coil capable of electromagnetic coupling with an external object; a power transmitting section performing power transmission using the power transmitting coil; and a detecting section that determines a Q value or a degree of variation thereof in a circuit including the power transmitting coil and that performs detection concerning a state of the electromagnetic coupling with the external object based on a determined result.

A power receiver according to an embodiment of the present disclosure includes: a power receiving coil capable of electromagnetic coupling with an external object; a power receiving section performing power reception using the power receiving coil; and a detecting section that determines a Q value or a degree of variation thereof in a circuit including the power receiving coil and that performs detection concerning a state of the electromagnetic coupling with the external object based on a determined result.

A power feed system according to an embodiment of the present disclosure includes: one or a plurality of power receivers; and one or a plurality of power transmitters that perform power transmission utilizing the electromagnetic coupling for the one or the plurality of power receivers. The power transmitter has a power transmitting coil capable of electromagnetic coupling with an external object, and a power transmitting section to perform power transmission using the power transmitting coil. The power receiver has a power receiving coil capable of electromagnetic coupling with an external object, and a power receiving section performing power reception using the power receiving coil. A detecting section that determines a Q value or a degree of variation thereof in a circuit including the power transmitting coil or the power receiving coil and that performs detection concerning a state of the electromagnetic coupling with the external object based on a determined result is provided at the power transmitter or the power receiver or both.

A detection method according to an embodiment of the present disclosure includes: a first step of determining a Q value or a degree of variation thereof in a circuit including a coil capable of electromagnetic coupling with an external object; and a second step of performing detection concerning a state of the electromagnetic coupling with the external object based on a result determined in the first step.

In the detector, the power transmitter, the power receiver, the power feed system, and the detection method according to the above-described respective embodiments of the present disclosure, a Q value or a degree of variation thereof in a circuit including a coil capable of electromagnetic coupling with an external object (for example, the power transmitting coil or the power receiving coil) is determined, and detection concerning a state of the electromagnetic coupling with the external object is performed based on the determined result. This makes it possible to detect a conductor such as a metal, or a circuit including an electromagnetically coupled coil without the necessity for a combined use of a primary side (power transmitting side) and a secondary side (power receiving side).

In the detector, the power transmitter, the power receiver, the power feed system, and the detection method according to the above-described respective embodiments of the present disclosure, it is possible to detect a conductor (including a semiconductor) such as a metal or a circuit including a coil without the necessity for a combined use of a primary side (power transmitting side) and a secondary side (power receiving side). Accordingly, this allows a conductor or a circuit including a coil to be detected conveniently.

BRIEF DESCRIPTION OF THE DRAWINGS

FIG. 5 is an explanatory schematic diagram showing a method of detecting a conductor.

DESCRIPTION OF EMBODIMENTS

Figure 1:
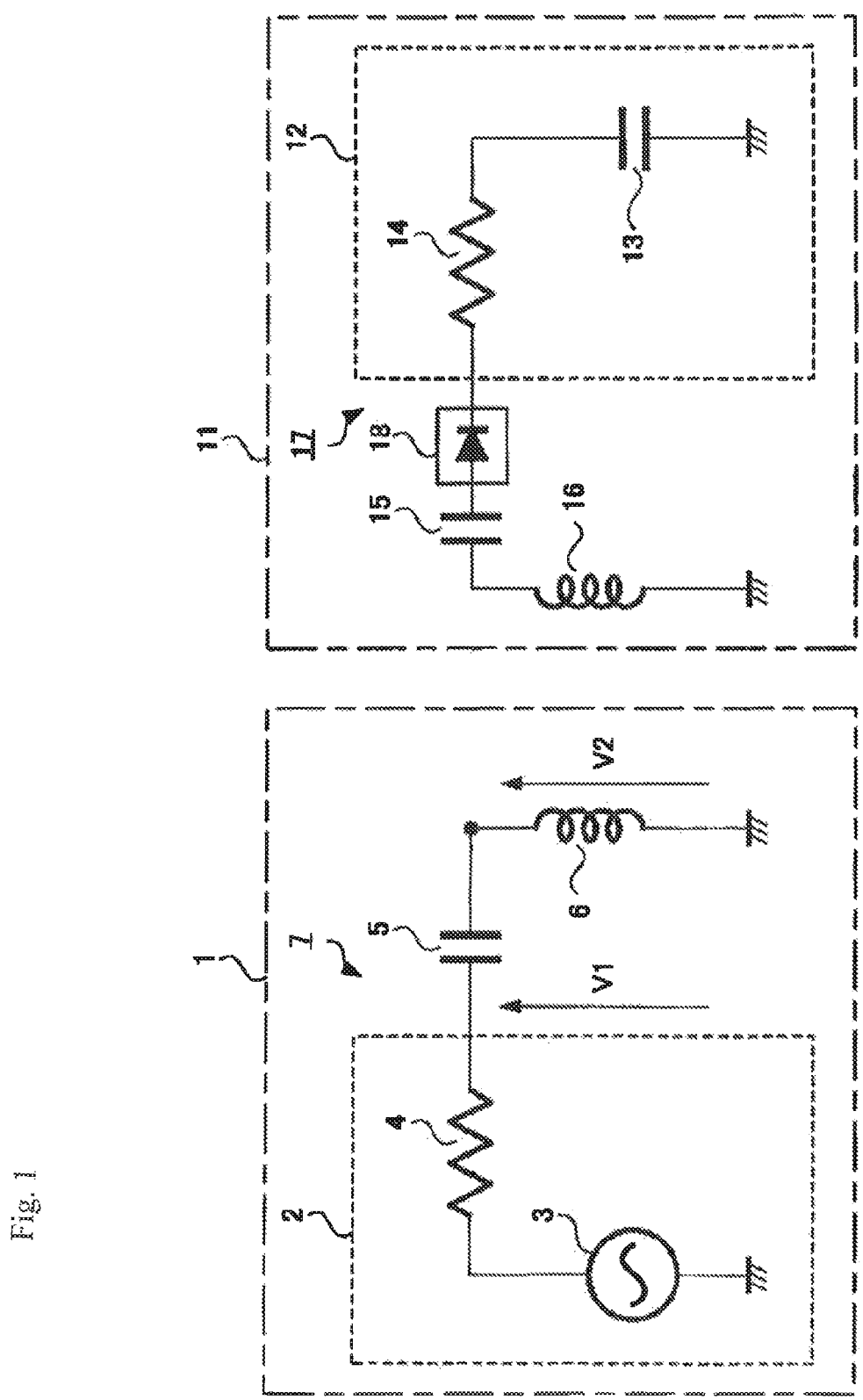
FIG. 1 is an explanatory circuit diagram showing an overview of a noncontact power transmission system according to a first embodiment of the present disclosure.

Hereinafter, some embodiments of the present disclosure are described with reference to the attached drawings. The descriptions are provided in the order given below. It is to be noted that any component parts which are used in common in each figure are denoted with the same reference numerals, and the redundant descriptions are omitted as appropriate.

1. First Embodiment (arithmetic processing section: an example of calculation of a Q value from a ratio of a voltage across a coil to an L-C voltage in a series resonant circuit)

2. Second Embodiment (arithmetic processing section: an example of calculation of a Q value using a half-value width method)

3. Third Embodiment (arithmetic processing section: an example of calculation of a Q value from a ratio of a real part component to an imaginary part component of impedance)

4. Others (various modification examples)

1. First Embodiment (Description of Noncontact Power Transmission System)

In a first embodiment of the present disclosure (hereinafter also referred to as "the present embodiment"), the description is provided on a configuration and a method for detecting, with use of a power transmitter or a power receiver in a noncontact power transmission system (noncontact power feed system), a conductor such as a metal, or a circuit including a coil that may be present in the vicinity of the power transmitter or the power receiver. Hereinafter, to detect a conductor such as a metal, or a circuit including a coil may be also termed "to detect a conductor and the like". It is to be noted that a conductor mentioned in the present specification encompasses a broadly-defined conductor, that is, a semiconductor.

In the first embodiment, a variation in a Q value representing a relationship of conservation and loss of energy (indicating a resonant intensity of a resonant circuit) in a power transmitter (primary side) or a power receiver (secondary side) is used to detect a conductor and the like. For example, if a metallic object is present in the vicinity of a power transmitting coil of a power transmitter or a power receiving coil of a power receiver, a line of magnetic force passes through the metallic object, causing an eddy current to be generated on the metallic object. Seen from a coil, this seems to be a an electromagnetic coupling of the metallic object and the coil that applies a real resistance load to the coil, leading to variation in a Q value of the coil. By measuring such a variation in the Q value, any metallic object (an electromagnetic coupling state) that may be present in the vicinity of the coil is detected. The electromagnetic coupling, which may be also called "electromagnetic field resonant coupling" or "electromagnetic resonance", includes an electric field coupling and a magnetic field coupling. Both of the couplings utilize the resonance to perform power transmission through the electric field coupling or the magnetic field coupling with only a resonating device. However, the electromagnetic coupling (electric field coupling or magnetic field coupling) using electromagnetic induction may be performed as an alternative to such a resonance.

FIG. 1 is an explanatory circuit diagram showing an overview of a noncontact power transmission system according to the first embodiment of the present disclosure. FIG. 1 shows an example of the most basic circuit configuration (in the case of the magnetic field coupling) for the noncontact power transmission system.

The noncontact power supply system (noncontact power feed system) according to the present embodiment is composed of one or a plurality of power transmitters 1 (one in the figure) and one or a plurality of power receivers 11 (one in the figure).

The power transmitter 1 carries out the noncontact power transmission utilizing the electromagnetic coupling for the power receiver 11. The power transmitter 1 is provided with a signal source 2 including an alternating-current power source 3 for generating an alternating-current signal and a resistor element 4; a capacitor 5; and a power transmitting coil (primary-side coil) 6 that is capable of electromagnetic coupling with an external object. The resistor element 4 gives a graphic representation of an internal resistance (output impedance) of the alternating-current power source 3. The capacitor 5 and the power transmitting coil 6 (an example of a coil) are connected with the signal source 2 in a manner of forming a series resonant circuit (an example of a resonant circuit). Further, a capacitance value (C value) of the capacitor 5 and an inductance value (L value) of the power transmitting coil 6 are adjusted to achieve the resonance at desired measurement frequency. A power transmitting section 7 that is composed of the signal source 2 and the capacitor 5 carries out the noncontact power transmission (electric power transmission (power feed)) to an external object through the power transmitting coil 6. In other words, the power transmitting section 7 is intended to perform the power transmission using the power transmitting coil 6.

The power receiver 11 receives a power transmitted in a noncontact manner from the power transmitter 1 utilizing the electromagnetic coupling. The power receiver 11 is provided with a charging section 12 including a capacitor 13 (secondary battery) and a resistor element 14; a rectifying section 18 converting an alternating-current signal into a direct-current signal; a capacitor 15; and a power receiving coil (secondary-side coil) 16 that is capable of electromagnetic coupling with an external object. The resistor element 14 gives a graphic representation of an internal resistance (output impedance) of the capacitor 13. The capacitor 15 and the power receiving coil 16 are connected with the charging section 12 in a manner of forming a series resonant circuit, and a capacitance value (C value) of the capacitor 15 and an inductance value (L value) of the power receiving coil 16 are adjusted to achieve the resonance at desired measurement frequency. A power receiving section 17 that is composed of the charging section 12, the rectifying section 18, and the capacitor 15 receives a power transmitted in a noncontact manner from an external object through the power receiving coil 16 (performs the power reception). In other words, this power receiving section 17 is intended to perform the power reception using the power receiving coil 16.

Given that a voltage between the power transmitting coil 6 and the capacitor 5 that compose a series resonant circuit is V1 (first voltage: an example of a voltage to be applied to a resonant circuit), and a voltage across the power transmitting coil 6 is V2 (second voltage), a Q value of the series resonant circuit is represented by Expression 1.

$$Q = \frac{V2}{V1} = \frac{2\pi fL}{r_s}$$ [Math. 1]

rs: effective resistance at frequency f.

The voltage V2 is obtained by multiplying the voltage V1 by a Q value. As a metallic object comes closer to the power transmitting coil 6, an effective resistance rs becomes greater, leading to a decrease in a Q value. In such a manner, as a metallic object comes closer to the power transmitting coil 6, a Q value (electromagnetic coupling state) to be measured varies, and thus detection of this variation makes it possible to detect a metallic object that may be present in the vicinity of the power transmitting coil 6.

It is to be noted that FIG. 1 shows a basic circuit including a series resonant circuit, and thus various forms may be possible as a detailed configuration given that the above-described circuit functions are provided. For example, although FIG. 1 shows the capacitor 13 as an example of a load to be provided at the power receiver 11, a configuration is not limited to the example. Alternatively, a configuration where the power receiver 11 has the signal source 2 (power transmitting section 7) to transmit a power in a noncontact manner to an external object via the power receiving coil 16, or a configuration where the power transmitter 1 is provided with a load to receive a power in a noncontact manner from an external object via the power transmitting coil 6 may be also permitted.

(Description of Detecting Circuit)

Figure 2:
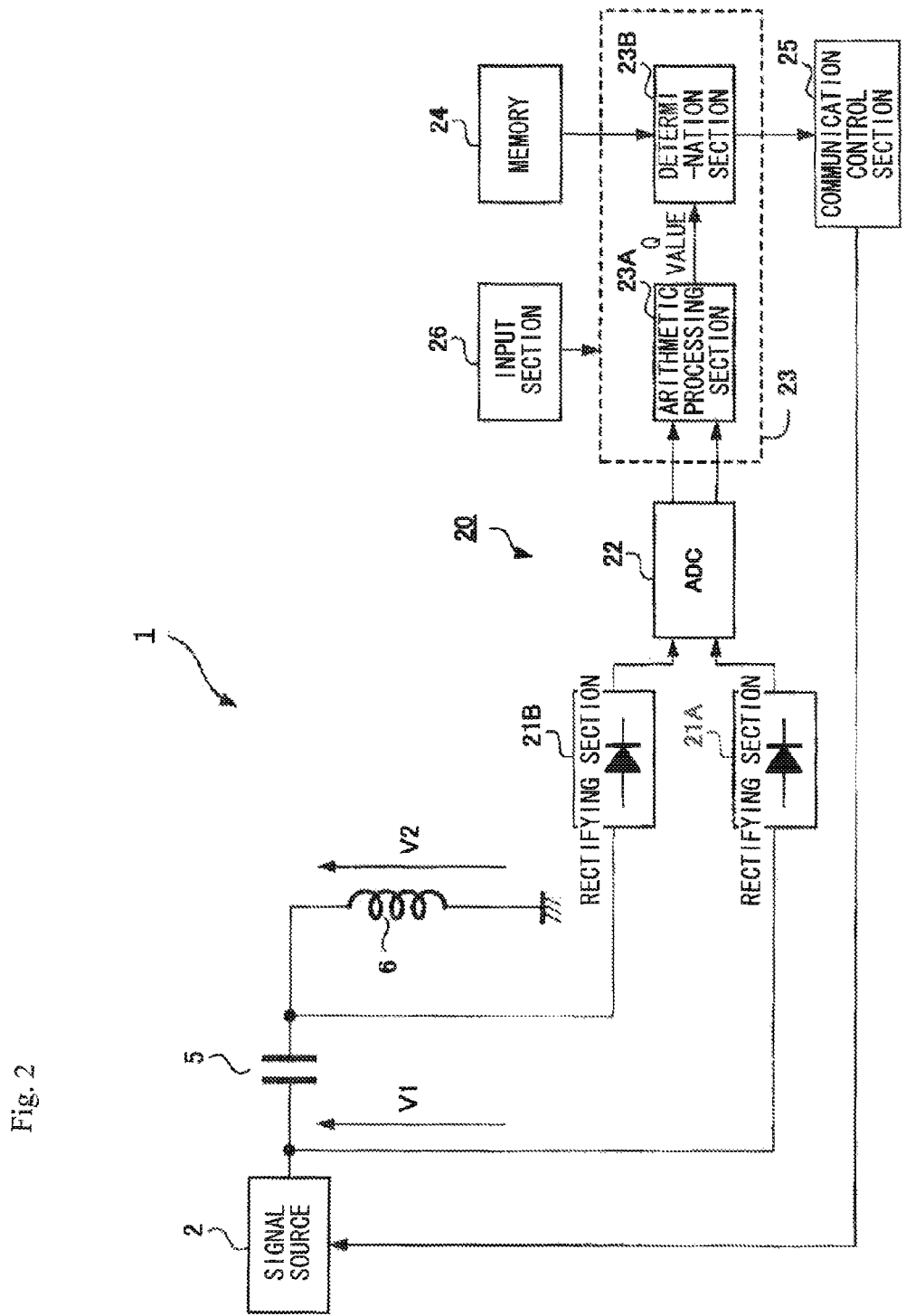
FIG. 2 is a schematic block diagram showing a configuration example of a detector (detecting circuit) that is provided at a power transmitter according to the first embodiment of the present disclosure.

FIG. 2 is a schematic block diagram showing a configuration example of a detector (detecting circuit) that is provided at the power transmitter according to the first embodiment of the present disclosure. The detecting circuit detects a conductor such as a metal, or a circuit including a coil. The power transmitter that is provided with the detecting circuit (detector) corresponds to a specific but not limitative example of a detector (electromagnetic coupling state detector).

A detecting circuit 20 according to the present embodiment, which corresponds to a specific but not limitative example of a detecting section (detector), includes rectifying sections 21A and 21B, an analog-to-digital converter (hereinafter referred to as an "ADC") 22, and a main control section 23. As described in details hereinafter, the detecting circuit 20 determines a Q value or a degree of variation in the Q value in a circuit including a coil (power transmitting coil 6 in this example) that is capable of electromagnetic coupling with an external object, while performing detection concerning a state of the electromagnetic coupling with the external object based on a determined result. As will hereinafter be described in details, in concrete terms, the detecting circuit 20 detects whether or not any other conductor (including a semiconductor) such as a metal, or any other circuit including a coil (power receiving coil 16 in this example) may be present in the vicinity of a coil (power transmitting coil 6 in this example) as a state of the electromagnetic coupling with an external object. In addition, when the presence of such a conductor or any other circuit in the vicinity of the power transmitting coil 6 is detected, the detecting circuit 20 also has a capability to further detect whether a detected object is either a conductor or any other circuit.

The rectifying section 21A converts an alternating-current signal (alternating-current voltage) input from between the power transmitting coil 6 and the capacitor 5 into a direct-current signal (direct-current voltage) to provide such a resultant signal as an output. Similarly, the rectifying section 21B converts an alternating-current signal (alternating-current voltage) input from between the signal source 2 and the capacitor 5 into a direct-current signal (direct-current voltage) to provide such a resultant signal to the ADC 22 as an output.

The ADC 22 converts analog direct-current signals input from the rectifying sections 21A and 21B into digital direct-current signals to output such resultant signals to the main control section 23.

The main control section 23, which corresponds to a specific but not limitative example of a control section, may be composed of, for example, an MPU (Micro-Processing Unit) to control the overall power transmitter 1. The main control section 23 includes a functionality as an arithmetic processing section 23A and a determination section 23B.

The arithmetic processing section 23A, which is a block to carry out a predetermined arithmetic processing, in the present embodiment, calculates a ratio of the voltage V1 to the voltage V2, that is, a Q value from a direct-current signal incoming from the ADC 22 to output a calculation result to the determination section 23B. More specifically, the arithmetic processing section 23A determines a Q value in a resonant circuit based on a ratio of the voltage V1 between the power transmitting coil 6 and the capacitor 5 in the resonant circuit to the voltage V2 across the power transmitting coil 6 in the resonant circuit. In such a manner, the arithmetic processing section 23A has a functionality to determine a Q value or a degree of variation thereof.

The determination section 23B compares a calculation result incoming from the determination section 23B with a threshold stored on a nonvolatile memory 24 to determine whether or not a conductor such as a metal, or a circuit including a coil may be present in the vicinity based on a comparison result. In other words, the determination section 23B has a functionality to determine a state of the electromagnetic coupling with an external object by comparing a Q value or a degree of variation thereof that is calculated by the arithmetic processing section 23A with a predetermined threshold. Hereupon, a threshold for a Q value (Ref_Q1) in a state where nothing is present in the vicinity of the power transmitting coil 6, or nothing is placed on the power transmitting coil 6 has been measured beforehand, and this threshold has been stored in the memory 24. Specifically, the threshold (Ref_Q1) corresponds to a Q value in a resonant circuit under a condition that a conductor and a circuit (any other circuit) including another coil is not present in the vicinity of the power transmitting coil 6.

A communication control section 25 controls generation of an alternating-current voltage by the signal source 2 (power transmitting section 7) in response to a control signal from the main control section 23, thereby allowing the power transmitter 1 to perform the noncontact power transmission or communication with an external object.

An input section 26 generates an input signal according to a user operation to output such a resultant signal to the main control section 23.

It is to be noted that, in the present embodiment, although a configuration where the detecting circuit (detector) is built into the power transmitter is employed, the detecting circuit (detector) may be provided in either the power transmitter or the power receiver, or both. In other words, such a detector (detecting section) may be provided in the power transmitter or the power receiver or both.

Figure 3:
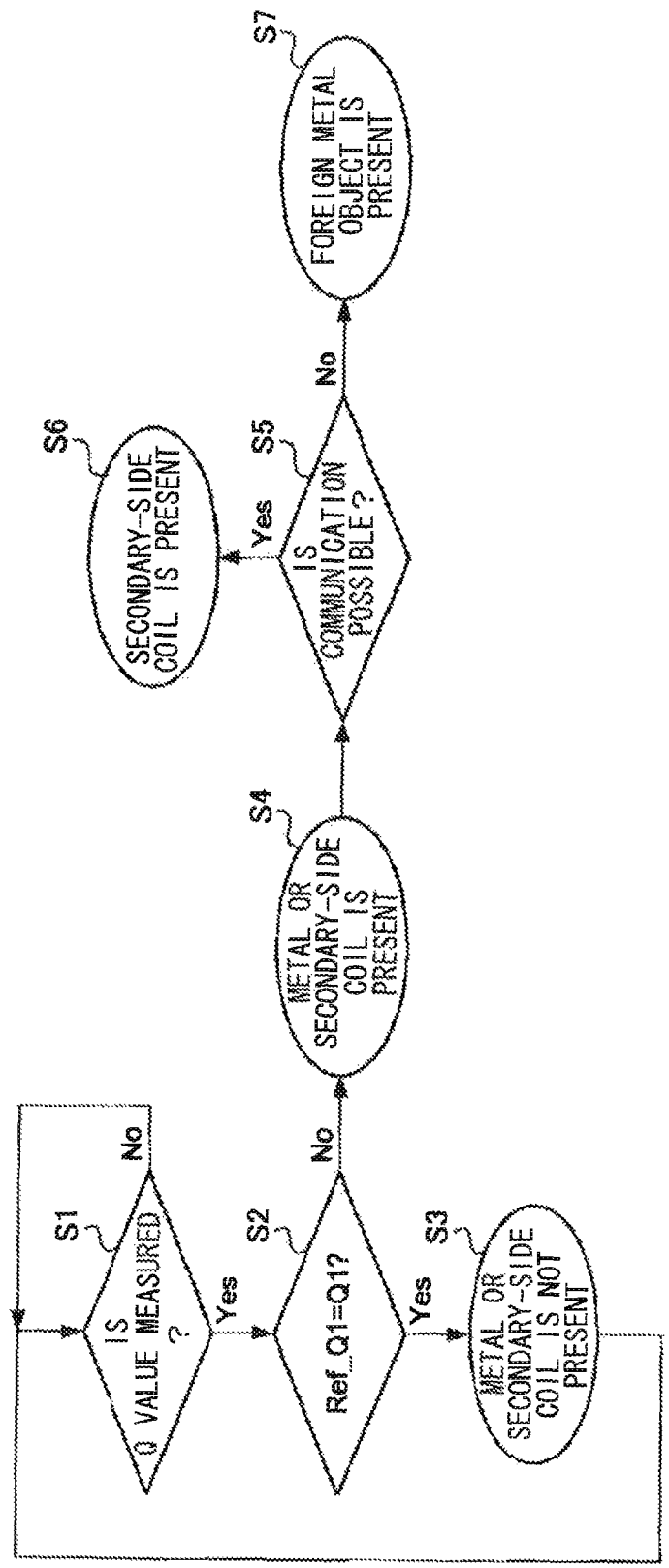
FIG. 3 is a flowchart showing detection processing according to the first embodiment of the present disclosure.

With reference to a flowchart shown in FIG. 3, the description is provided on a detection process (electromagnetic coupling state detection process) that is carried out by the detecting circuit 20.

The main control section 23 on the detecting circuit 20 carries out a measurement process of a Q value in a series resonant circuit on a periodic basis, and determines whether or not a measurement of the Q value is made (step S1). The process proceeds to a step S2 when a measurement is made, and a determination process in the step S1 is repeated when no measurement is made. It is to be noted that, as described previously, a measurement of the Q value is made using the voltages V1 and V2 that are obtained through analog-to-digital conversion by the ADC 22 following the rectification by the rectifying sections 21A and 21B. The arithmetic processing section 23A calculates a ratio of the voltage V1 to the voltage V2 (Q value) to output the calculated value to the determination section 23B.

It is to be noted that the main control section 23 may perform a measurement process of the Q value by detecting an input signal including instruction information on a measurement of the Q value from the input section 26.

Next, the determination section 23B compares the measured Q value with the threshold for the Q value (Ref_Q1) in a state where nothing is present in the vicinity of the power transmitting coil 6, or nothing is placed on the power transmitting coil 6 to determine whether or not the measured Q value is within a range of the threshold (Ref_Q1) (step S2).

Here, if the measured Q value is within a range of the threshold (Ref_Q1), the determination section 23B determines that a conductor such as a metal, or a circuit including a coil is not present in the vicinity (step S3), and the process returns back to the step S1.

On the other hand, if the measured Q value is not within a range of the threshold (Ref_Q1), the determination section 23B determines that a conductor such as a metal, or a circuit including a coil is present in the vicinity (step S4), and the process proceeds to a step S5.

Here, if the presence of a conductor or a circuit (any other circuit) including a coil in the vicinity of the power transmitting coil 6 is detected, the determination section 23B determines whether or not the power transmitter 1 is capable of communicating with an external object (step S5). In concrete terms, the determination section 23B instructs the communication control section 25 to perform communication with an external object. The communication control section 25 attempts communication with an external object by making the signal source 2 (power transmitting section 7) generate an alternating-current voltage and by sending out a radio signal (transmission signal) from the power transmitter 1 (power transmitting coil 6) to the external object. Subsequently, the communication control section 25 determines whether or not communication with the external object is possible depending on the presence or absence of a response to the transmission signal.

More specifically, if there is a response from the external object to the transmission signal from the power transmitter 1 (a response is returned back), the determination section 23B determines that communication with the external object is possible, and decides that a circuit including a coil is present in the vicinity (step S6). On the contrary, if there is no response from the external object to the transmission signal from the power transmitter 1, the determination section 23B determines that communication with the external object is not possible (unfeasible), and decides that a conductor such as a metal is present in the vicinity (step S7).

In such a manner, the determination section 23B determines that a detected object is either a conductor or any other circuit (circuit including any other coil) based on a result of determining whether or not communication with the external object via the power transmitting coil 6 is possible. In concrete terms, when it is determined that communication with the external object is possible, the determination section 23B decides that the detected object is any other circuit, and when it is determined that communication with the external object is not possible, the determination section 23B decides that the detected object is a conductor.

Figure 4A:
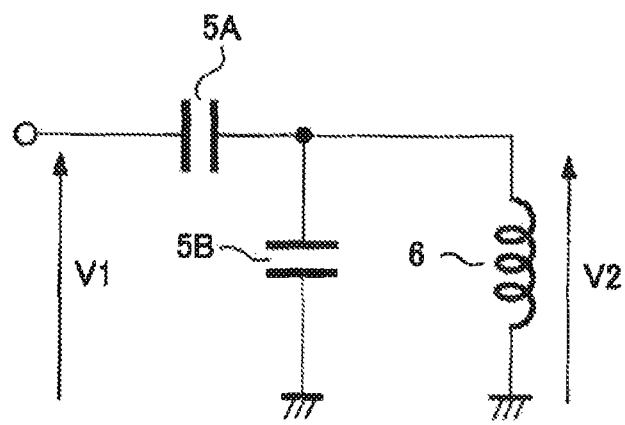
FIGS. 4(a) and 4(b) are each a circuit diagram showing another example (parallel resonant circuit) of a resonant circuit.
Figure 4B:
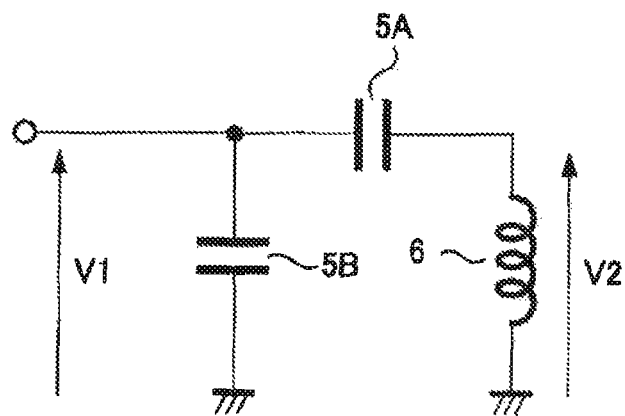

It is to be noted that, in the present embodiment, although the description is provided on an application example where the detecting circuit 20 is connected with a series resonant circuit, a parallel resonant circuit may be alternatively used as a resonant circuit. Each of FIGS. 4(*a*) and 4(*b*) shows an example of the parallel resonant circuit. In an example in FIG. 4(*a*), the parallel resonant circuit is configured in such a manner that a capacitor 5A is connected in series with a parallel circuit of a capacitor 5B and the power transmitting coil 6. Further, in an example in FIG. 4(*b*), the parallel resonant circuit is configured in such a manner that the capacitor 5B is connected in parallel with a series circuit of the capacitor 5A and the power transmitting coil 6. The detecting circuit 20 calculates a Q value utilizing the voltage V1 between the power transmitting coil 6 and the capacitor 5A as well as the voltage V2 across the power transmitting coil 6 that are obtained in the parallel resonant circuit illustrated in each of FIGS. 4(a) and 4(b). The above-described series resonant circuit and parallel resonant circuit are illustrated by an example for the purpose of explaining a principle of the detection method (electromagnetic coupling state detection method) according to the embodiment of the present disclosure, and a configuration of the resonant circuit is not limited to these examples.

(Measurement Results)

Next, the description is provided on measurement results of a Q value in a case where a metallic object is actually placed in the vicinity of the power transmitting coil 6 on the power transmitter 1.

Figure 6:
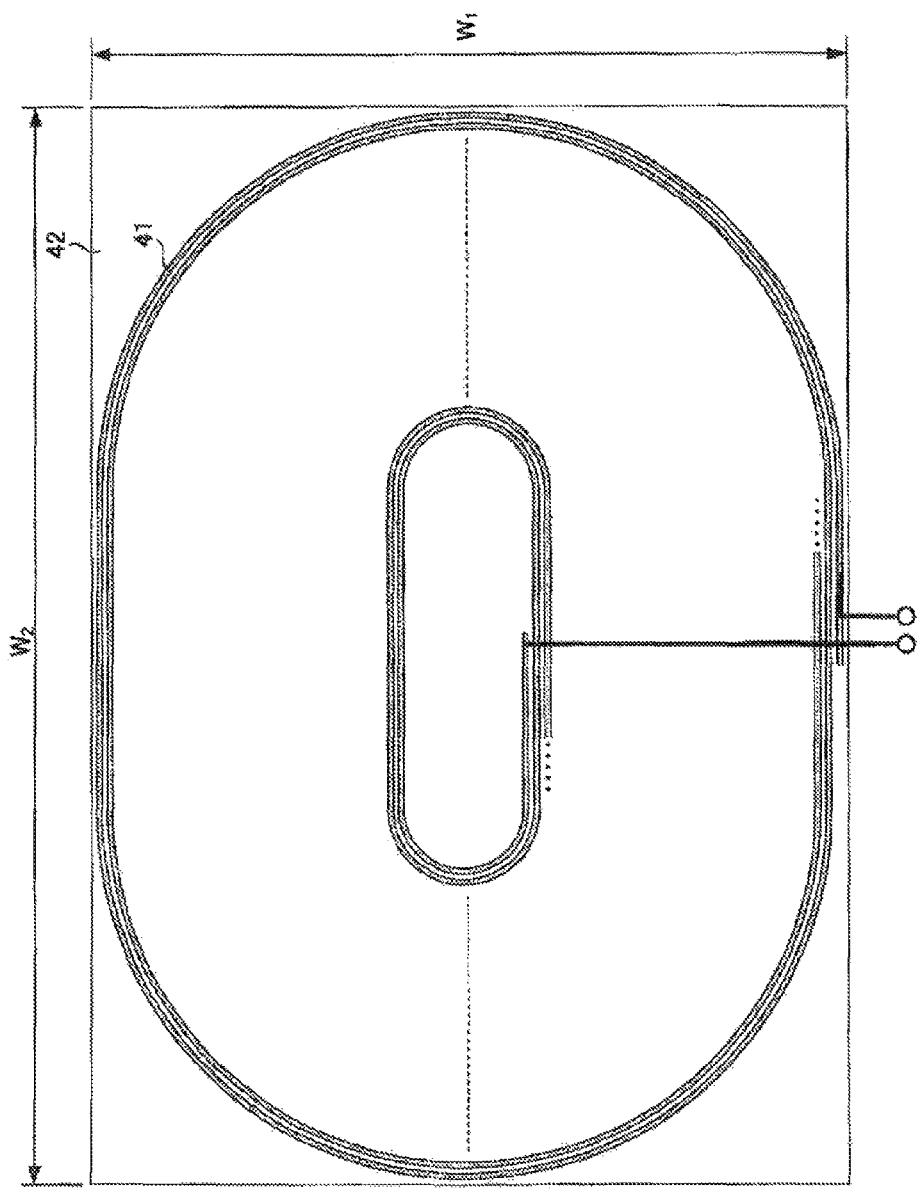
FIG. 6 is a simplified schematic diagram showing an example of a coil in use for a power transmitter and a power receiver.

As shown in FIG. 5, a measurement was made in such a manner that the detecting circuit 20 was operated with a metallic object 31 brought close to the power transmitter 1 that was mounted on a pedestal 30. Further, in the measurement, as the power transmitting coil 6, a spiral coil with a size of 150 mm (W1)*190 mm (W2) which is wound around using a litz wire 41 (wire diameter .phi.: 1.0 mm) that is a conductor wire with a plurality of narrow copper wires twisted as illustrated in FIG. 6 was used. Additionally, a magnetic material 42 made of a ferrite material with a thickness of 1.0 mm is laid against a backside of the spiral coil. An L value and a Q value of the power transmitting coil 6 when the metallic object 31 is not present in the vicinity are 192.0 .mu.H and 230.7, respectively. A C value of the capacitor 5 to be resonated is 8.2 nF. In this case, a resonant frequency of the series resonant circuit including the power transmitting coil 6 becomes 127.0 kHz.

Further, given that the Q value of a capacitor is Qc, and the Q value of a coil is QL, the Q value of the resonant circuit is typically represented by a relationship of 1/{(1/Qc)+(1/QL)}. The Q value of the capacitor 5 that was used for the measurement is designed to be sufficiently high relative to the Q value of the power transmitting coil 6, and thus any effect on the Q value of the series resonant circuit may be negligible. However, on the contrary, the Q value of the power transmitting coil 6 may be designed to be sufficiently high relative to the Q value of the capacitor 5, or both of the power transmitting coil 6 and the capacitor 5 may have the nearly equivalent Q values.

Figure 7:
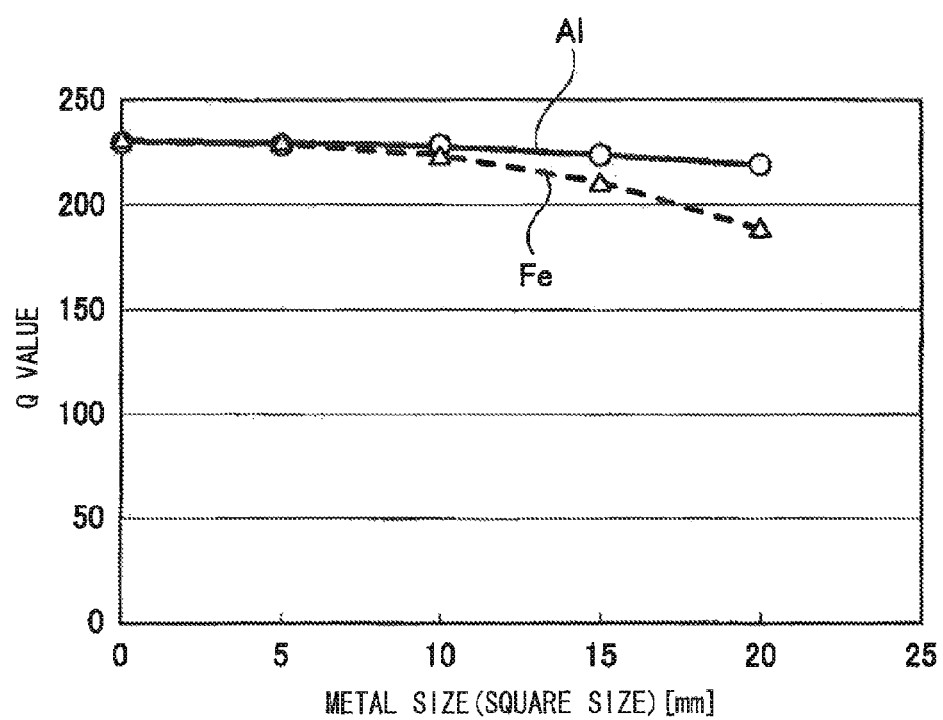
FIG. 7 is a graph showing the characteristics of Q values versus metal sizes (square sizes).

An iron (Fe) material and an aluminum (Al) material each having a thickness of 1.0 mm are brought close to the series resonant circuit including the power transmitting coil 6. A distance between the power transmitting coil 6 and each of the metallic objects is fixed to 8 mm. Subsequently, the Q values are measured using the detecting circuit 20 on the power transmitter 1 while changing a size of each metallic object. FIG. 7 shows a graph representing the characteristics of the Q values versus metal sizes (square sizes).

A measurement result using the iron (Fe) material and the aluminum (Al) material indicates that there may be a difference depending on a metallic material quality, although with an increase in a size of the metallic object 31, an effective resistance seems to increase equivalently, leading to deterioration in the Q value. In other words, an increasing size of the metallic object is equivalent to the presence of the metallic object in the vicinity of the power transmitting coil 6 given the metallic object of the same size. The determination section 23B compares the measured Q value (or a rate of change in the Q value) with a threshold stored on the memory 24 to determine whether or not the metallic object is present depending on whether or not the Q value is within a range of the threshold.

In such a manner, it is possible to detect the presence of a metallic object in the vicinity of the power transmitting coil 6 based on a measurement result of the Q value. The amount of deterioration in the Q value varies depending on a metallic material quality, and a metal with a greater degree of deterioration in the Q value may be easier to generate heat. In other words, the Q value is related to a heat generating factor, and a metal to be detected that is likely to generate heat may be easier to be detected.

Next, the description is provided on measurement results of a Q value in a case where the power receiving coil 16 which is resonated with the power transmitting coil 6 on the power transmitter 1, that is, the power receiver 11 is placed.

Figure 8:
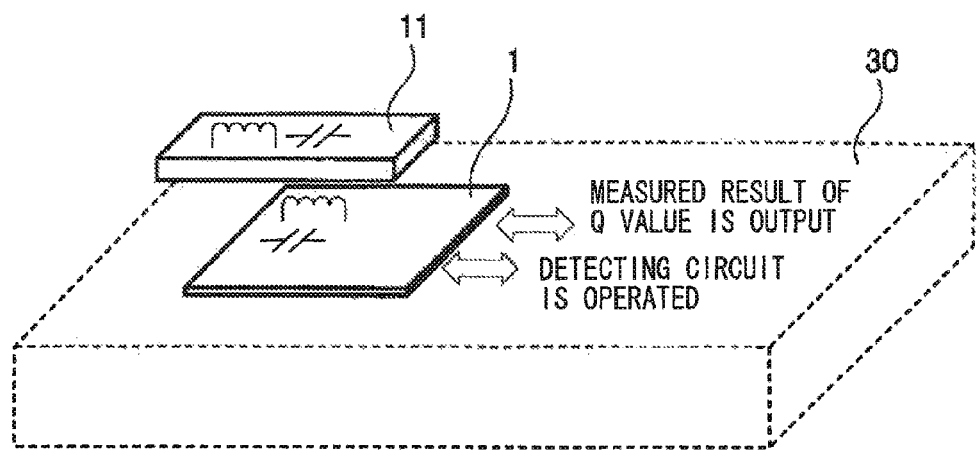
FIG. 8 is an explanatory schematic diagram showing a method of detecting a circuit including a coil.

As shown in FIG. 8, as is the case with the metallic object 31, a measurement was made in such a manner that the detecting circuit 20 was operated with the power receiver 11 brought close to the power transmitter 1 that was mounted on the pedestal 30. Further, a coil used as the power receiving coil 16 in this measurement is a spiral coil with a coil size of 30 mm (W1)*50 mm (W2) which has a structure similar to that of the spiral coil illustrated in FIG. 6, and which is wound around using the litz wire 41 with a wire diameter .phi. of 0.65 mm. As an alternative to the magnetic material 42, a magnetic sheet made of a ferrite material having a thickness of 0.2 mm is laid against a backside of the spiral coil. An L value and a Q value of the power transmitting coil 6 when the power receiver 11 is not present in the vicinity are 14.0 .mu.H and 48.4, respectively. A resonant frequency of the series resonant circuit including the power receiving coil 16 is 127.0 kHz. The power transmitting coil 6 on the power transmitter 1 is the same as that illustrated in FIG. 6. A distance between the power transmitting coil 6 and the power receiving coil 16 is fixed to 8 mm.

Figure 9:
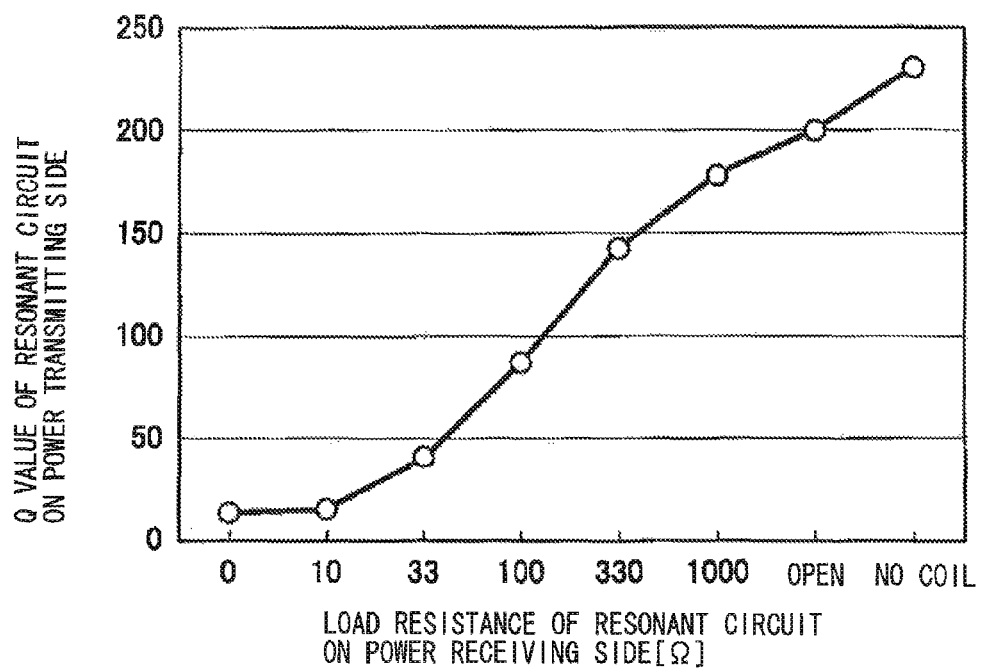
FIG. 9 is a graph showing the characteristics of a Q value of a resonant circuit at a power transmitting side versus a load resistance of a resonant circuit at a power receiving side.

Variations in the Q values of the power transmitting coil 6 in changing a value of a resistance load that was connected with the series resonant circuit on the power receiver 11 in such a state were measured using the detecting circuit 20. FIG. 9 shows a graph representing the characteristics of a Q value of the resonant circuit on a power transmitting side versus a load resistance of the resonant circuit on a power receiving side. In the figure, "open" denotes that the load side of the series resonant circuit on the power receiver 11 is put in an open state. Further, "no coil" denotes a state where no power receiving coil 16 is connected.

It is seen from FIG. 9 that, with a decrease in the load resistance of the resonant circuit on the power receiving side, the Q value to be measured at the power transmitter 1 is on the decrease. Further, from the characteristic curve in FIG. 9, the same trend as above except for a slight variation amount was also found in a nonresonant coil as well (not shown in the figure). The determination section 23B compares the measured Q value (or a rate of change in the Q value) with a threshold stored on the memory 24 to determine whether or not a circuit including a coil is present depending on whether or not the Q value is within a range of the threshold. In such a manner, it is possible to detect a circuit including a coil that may be electromagnetically coupled with the power transmitting coil 6 by measuring the Q value of the series resonant circuit including the power transmitting coil 6.

Next, variations in the Q values at the time when a metallic object was interposed between the power transmitting coil 6 and the power receiving coil 16 were measured in the same way.

Figure 10:
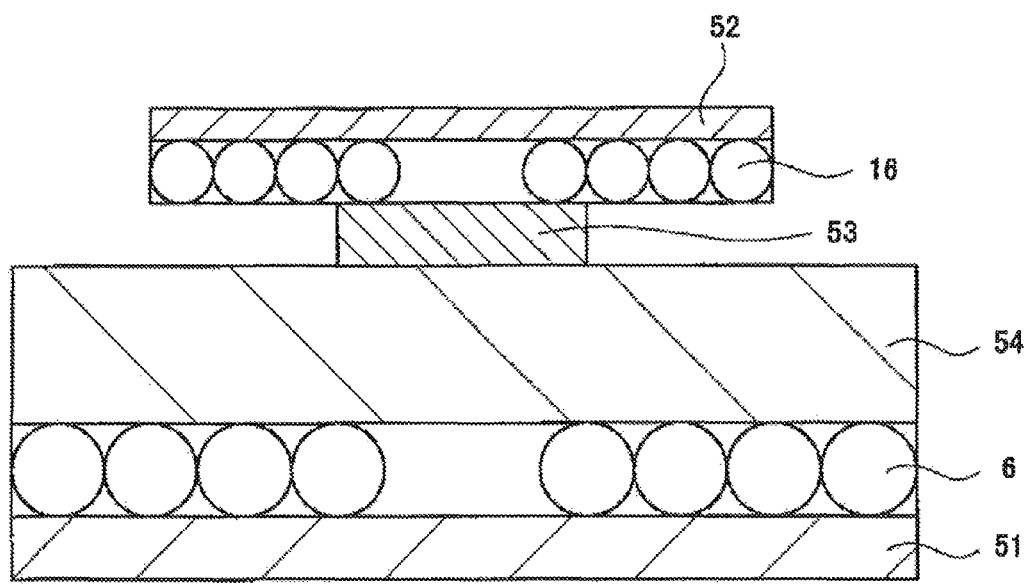
FIG. 10 is a schematic cross-sectional view showing a state where a metallic object is interposed between a power transmitting coil and a power receiving coil.

FIG. 10 is a schematic cross-sectional view showing a state where a metallic object is interposed between the power transmitting coil 6 and the power receiving coil 16. A metallic object 53 and a spacer 54 are disposed between the power transmitting coil 6 with a magnetic material 51 laid against the backside thereof and the power receiving coil 16 with a magnetic sheet 52 attached against the backside thereof. In this measurement, when no metallic object is interposed, the Q value of the series resonant circuit on the power transmitter 1 is 230.7, the Q value of the series resonant circuit on the power receiver 11 is 48.4, a coupling factor k that is a degree of the electromagnetic coupling between the power transmitting coil 6 and the power receiving coil 16 is 0.10, and an inter-coil efficiency is 0.83. A distance between the power transmitting coil 6 and the power receiving coil 16 at this time is 8 mm.

Figure 11:
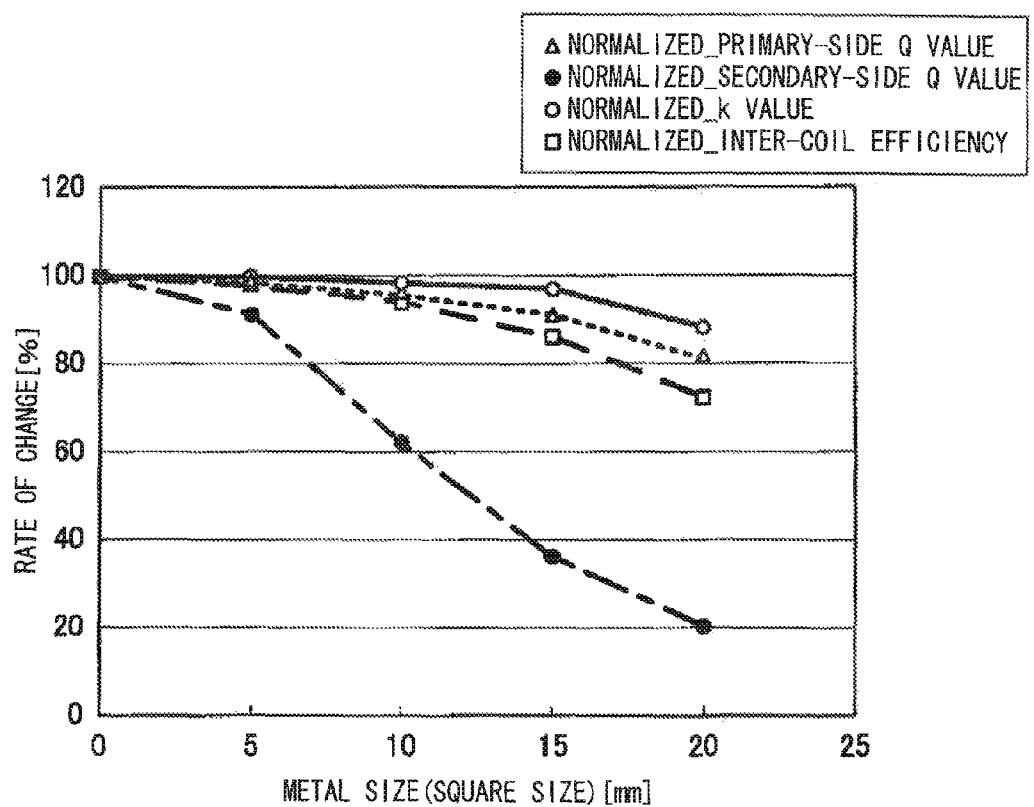
FIG. 11 is a graph showing the various characteristics versus metal sizes (square sizes).

FIG. 11 shows measurement results obtained from the same circuit for the Q values of the series resonant circuits on the power transmitter 1 (primary side) and the power receiver 11 (secondary side), the coupling factor k, and the inter-coil efficiency at the time when the metallic object 53 with a thickness of 1.0 mm is interposed.

A graph shown in FIG. 11 is represented with a rate of change where each value at the time when the metallic object 53 is not interposed is normalized as 100%. It is seen from this graph that the Q value of the secondary-side coil has a greater rate of change as compared with a rate of change in the Q value of the primary-side coil, the coupling factor k and the inter-coil efficiency that may vary depending on a distance between coils or orientation of a coil. Accordingly, as compared with currently-available transmitting/receiving power efficiency methods, it is possible to detect a smaller metallic object that is interposed between the primary side (power transmitting coil 6) and the secondary side (power receiving coil 16) by capturing variation in the Q value of the secondary-side coil. In other words, if the detecting circuit 20 according to the present embodiment that detects the Q value is provided at the power receiver (secondary side), this makes it possible to detect a conductor and the like using only the power receiver, as well as to achieve higher detection sensitivity as compared with existing methods. For example, the determination section 23B compares the measured rate of change in the Q value for the secondary-side coil with a threshold (for example, 90%) stored on the memory 24, and determines that a metallic object is present between the primary-side coil and the secondary-side coil when the rate of change in the Q value is less than 90%, thereby allowing to detect such a metallic object.

Meanwhile, an inter-coil efficiency (.eta.rf) is obtained uniquely in theory from a coupling factor k that is a degree of the electromagnetic coupling between a primary-side coil and a secondary-side coil, as well as a primary-side Q value (Q1) and a secondary-side Q value (Q2) that are each of Q values for a series resonant circuit with no load. Computational expressions to be used for obtaining the inter-coil efficiency (.eta.rf) are given in Expression (2) to Expression (4).

$$\eta_{rf} = \frac{S^2}{\left(1 + \sqrt{1+S^2}\right)^2} \quad \text{[Math. 2]}$$

$$S = kQ \quad \text{[Math. 3]}$$

$$Q = \sqrt{Q_1 Q_2} \quad \text{[Math. 4]}$$

In the present embodiment utilizing the electromagnetic coupling, even though the coupling factor k is low, Q values in the series resonant circuits at the primary and secondary sides are set to high values, thereby enhancing a degree of freedom in arrangement of the primary-side coil and the secondary-side coil. As an example, a design is made to ensure that the coupling factor k between the primary-side coil and the secondary-side coil is 0.5 or less, and Q values of the primary-side coil or the secondary-side coil or both are 100 or more. The same is true for second and third embodiments of the present disclosure to be hereinafter described. As a matter of course, however, the present embodiment is not limited to such a numerical value example.

Advantageous Effects of First Embodiment

According to the above-described first embodiment, a detecting circuit (detector) that is built in a primary side (power transmitter) or a secondary side (power receiver) determines a Q value or a degree of variation thereof in a circuit including a coil capable of electromagnetic coupling with an external object and performs detection concerning a state of the electromagnetic coupling with the external object based on a determined result. This makes it possible to detect a conductor (including a semiconductor) such as a metal, or a circuit including an electromagnetically coupled coil without the necessity for a combined use of a primary side (power transmitting side) and a secondary side (power receiving side). Accordingly, this allows a conductor or a circuit including a coil to be detected conveniently.

It is to be noted that, on the contrary, for example, in a method of detecting a metallic object based on information on an amplitude and a phase in the event of variation in the load of a power receiver (secondary side), or a method of detecting a metallic object from variation in the transmitting/receiving power efficiency, it is necessary for detecting a metallic object to perform communication by combined use of a power transmitter and a power receiver. In concrete terms, it may be also impossible to detect a metallic object in the event that any signal arising between a metallic object other than a power receiving circuit and a proper power receiver for which communication is disabled should be ridden on a coil of a power transmitter.

Further, since a power transmitting coil or a power receiving coil that is provided with a power transmitter or a power receiver, respectively, is used as a sensor, there is no necessity for providing any other special sensors, which is quite advantageous from a viewpoint of space saving and cost saving. On the contrary, for example, in a method of detecting a metallic object by the use of a magnetic sensor, a capacitive sensor, an infrared sensor, or the like, it is necessary to arrange a sensor in a power transmitter and a power receiver in addition to the power transmitting coil or the power receiving coil. This adds a restriction in design to a device housing, which is also disadvantageous from a cost standpoint as well.

Additionally, unlike an inductance and a capacitance, a Q value correlates with a heat generating factor, and thus a detecting circuit (detector) using the Q value according to the first embodiment is easy to detect any metal to be detected as much as possible that is likely to generate heat.

What is more, as compared with existing circuits for detecting a conductor such as a metal, or a circuit including an electromagnetically coupled coil in an inter-coil efficiency method, the present embodiment using the Q value achieves higher detection sensitivity.

It is to be noted that, in the present embodiment, although the description is provided on a case of the magnetic field coupling (see FIG. 1) as an example of the electromagnetic coupling, the electric field coupling may be taken as an example. The magnetic field coupling and the electric field coupling exhibit the same behavior except for only a difference that a coupling is based on an electric field or a magnetic field. In the case of the electric field coupling, this is allowed to be described as an equivalent circuit in a state where a capacitor on a power transmitter and a capacitor on a power receiver are arranged in opposition to each other. On this occasion, the Q value is obtained by measuring a voltage between a coil and a capacitor on a series resonant circuit as a voltage V1 and by measuring a voltage across the capacitor as a voltage V2.

2. Second Embodiment

In the first embodiment, the arithmetic processing section 23A obtains a Q value from the voltage V1 between the power transmitting coil and the capacitor on the series resonant circuit and the voltage V2 across the power transmitting coil, although in a second embodiment, the Q value is obtained in a half-value width method. In other words, in the arithmetic processing section 23A according to the second embodiment, the Q value in a resonant circuit (series resonant circuit or parallel resonant circuit) is obtained by using the half-value width method in the resonant circuit.

Figure 12:
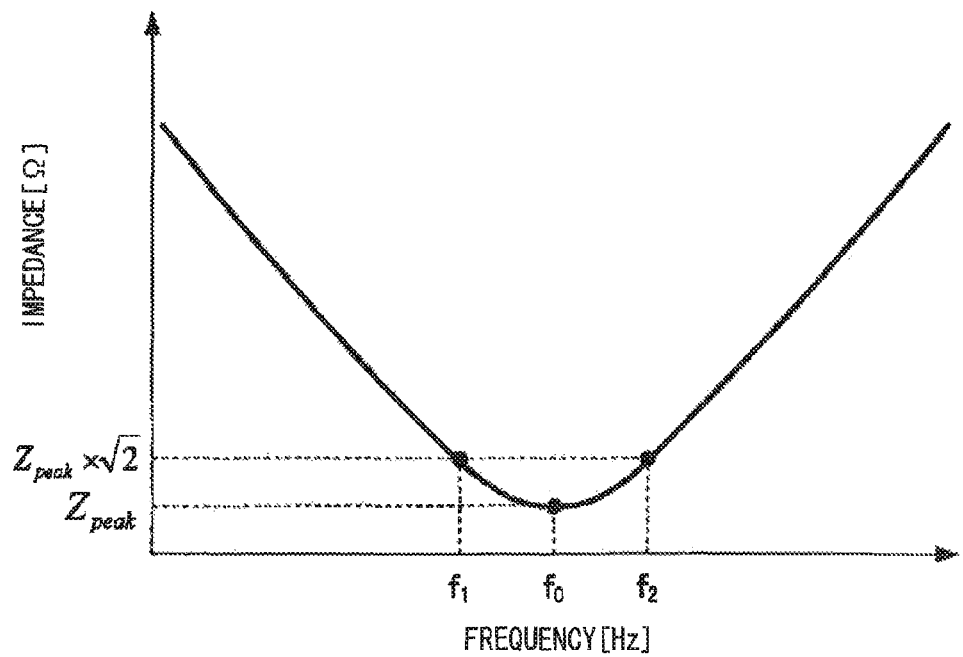
FIG. 12 is a graph showing the frequency characteristics of impedance in a series resonant circuit according to a second embodiment of the present disclosure.

In the half-value width method, in the case where a series resonant circuit is configured, as shown in FIG. 12, the Q value is obtained from Expression (5) using a bandwidth (frequency range of $f_1$ to $f_2$) at which impedance of 2 times as much as an absolute value for impedance ($Z_{peak}$) at resonant frequency $f_0$ is achieved. In other words, in this case, the arithmetic processing section 23A obtains the Q value in the series resonant circuit using the half-value width method based on the resonant frequency $f_0$ in the series resonant circuit and the frequency bandwidth (frequency range of $f_1$ to $f_2$) at which impedance of 2 times as much as an absolute value for impedance at the resonant frequency $f_0$ is achieved.

$$Q = \frac{f_0}{f_2 - f_1} \quad \text{[Math. 5]}$$

Figure 13:
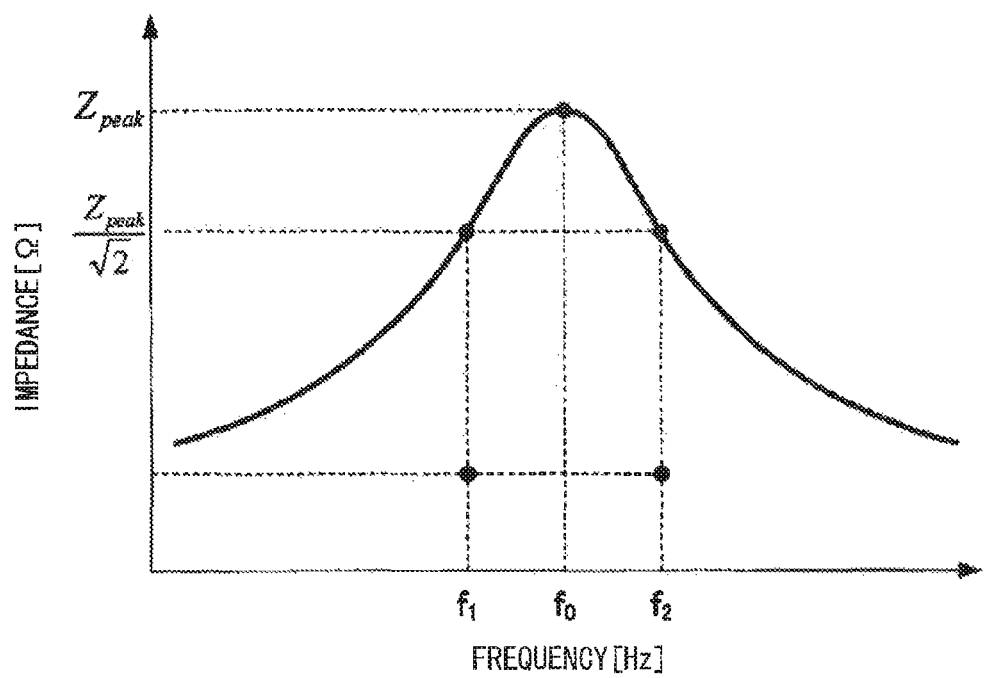
FIG. 13 is a graph showing the frequency characteristics of impedance in a parallel resonant circuit according to the second embodiment of the present disclosure.

Further, in the case where a parallel resonant circuit is configured, as shown in FIG. 13, the Q value is obtained from Expression (5) using a bandwidth (frequency range of $f_1$ to $f_2$) at which impedance of ($1/\sqrt{2}$ 2) times as much as an absolute value for impedance ($Z_{peak}$) at resonant frequency $f_0$ is achieved. In other words, in this case, the arithmetic processing section 23A obtains the Q value in the parallel resonant circuit using the half-value width method based on the resonant frequency $f_0$ in the parallel resonant circuit and the frequency bandwidth (frequency range of $f_1$ to $f_2$) at which impedance of ($1/2$) times as much as an absolute value for impedance at the resonant frequency $f_0$ is achieved.

Also in the second embodiment where the Q value is determined in such a manner, it is possible to obtain the same advantageous effects as with the first embodiment by virtue of the function similar to that in the first embodiment. It is to be noted that the second embodiment is also applicable to both of the electric field coupling and the magnetic field coupling that are mentioned in the first embodiment.

3. Third Embodiment

Unlike the first and second embodiments, a third embodiment represents an example where the arithmetic processing section 23A calculates the Q value from a ratio of a real part component to an imaginary part component of impedance in a resonant circuit. In the present embodiment, a real part component and an imaginary part component of impedance are determined using an automatic balanced bridge circuit and a vector ratio detector. In other words, the arithmetic processing section 23A according to the second embodiment determines the real part component and the imaginary part component of impedance in a resonant circuit using the automatic balanced bridge circuit and the vector ratio detector, and obtains the Q value in the resonant circuit from a ratio of the real part component to the imaginary part component.

Figure 14:
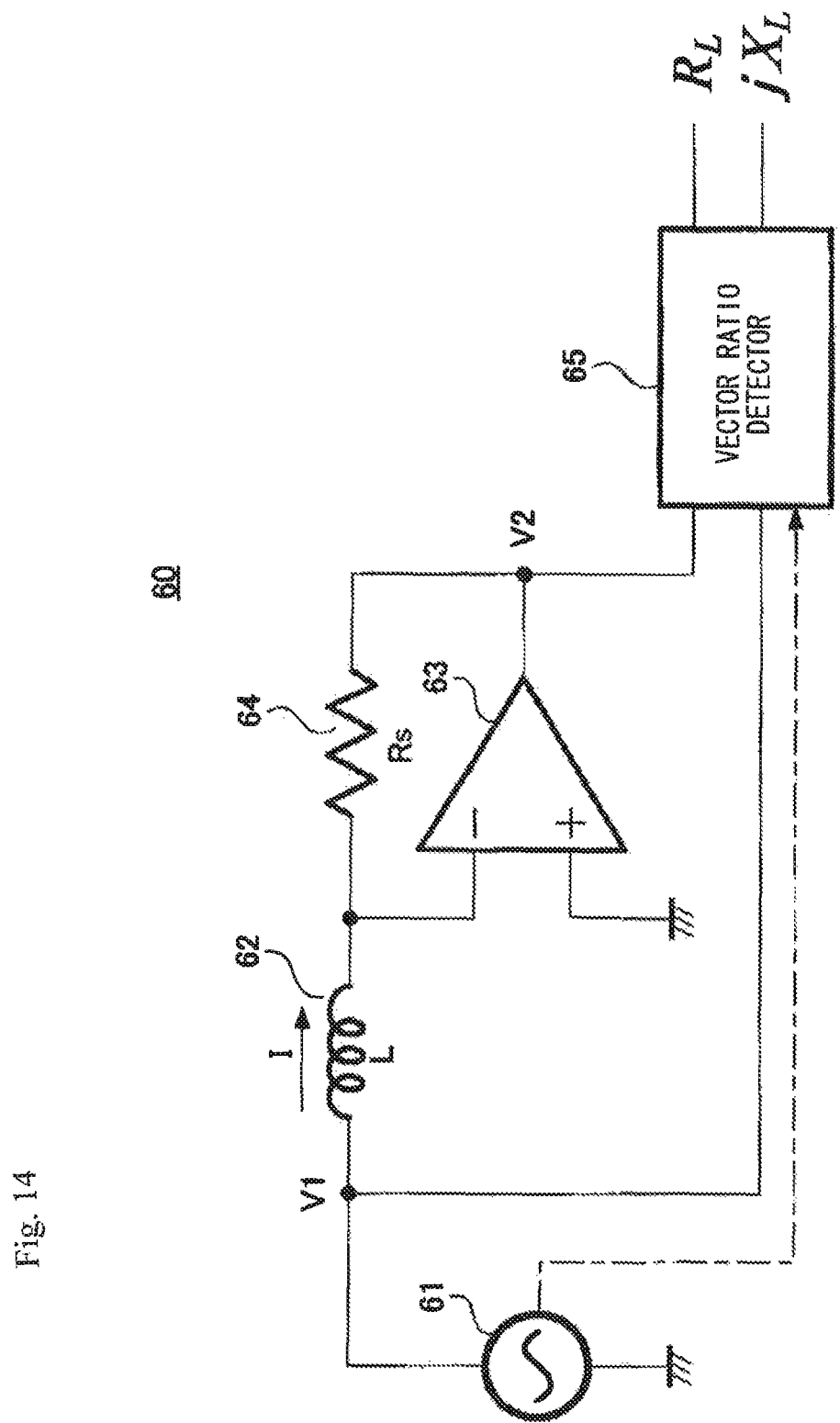
FIG. 14 is a circuit diagram for calculating a Q value from a ratio of a real part component to an imaginary part component of impedance according to a third embodiment of the present disclosure.

FIG. 14 is a circuit diagram of an automatic balanced bridge for calculating the Q value from a ratio of a real part component to an imaginary part component of impedance according to the third embodiment.

An automatic balanced bridge circuit 60 shown in FIG. 14 is configured in the same manner as a typically well-known inverting amplifier circuit. A coil 62 is connected with an inverting input terminal (negative terminal) of an inverting amplifier 63, and a noninverting input terminal (positive terminal) is grounded. Subsequently, using a feedback resistor element 64, a negative feedback is applied from an output terminal to the inverting input terminal (negative terminal) of the inverting amplifier 63. Further, an output (voltage V1) of an alternating-current power supply 61 for inputting an alternating-current signal to the coil 62 and an output (voltage V2) of the inverting amplifier 63 are input to a vector ratio detector 65. The coil 62 corresponds to the power transmitting coil 6 or the power receiving coil 16 in FIG. 1.

The automatic balanced bridge circuit 60 operates in such a manner that a voltage on the inverting input terminal (negative terminal) becomes zero at any time by a negative feedback action. Further, a current flowing from the alternating-current power supply 61 to the coil 62 flows into the feedback resistor element 64 in almost all cases because of a large input impedance of the inverting amplifier 63. As a result, a voltage across the coil 62 becomes equal to the voltage V1 of the alternating-current power supply 61, and an output voltage of the inverting amplifier 63 becomes a product of a current I flowing through the coil 62 and a feedback resistance Rs. The feedback resistance Rs is a given reference resistance. Therefore, if a ratio of the voltage V1 to the voltage V2 is determined by detecting those voltages, impedance is obtained. Since the vector ratio detector 65 determines the voltage V1 and the voltage V2 as a complex number, information on a phase of the alternating-current power supply 61 (denoted by a dashed line) is utilized.

In the present embodiment, by the use of such an automatic balanced bridge circuit 60, such a vector ratio detector 65, and the like, a real part component $R_L$ and an imaginary part component $X_L$ of impedance $Z_L$ in a resonant circuit is determined, and the Q value is obtained from a ratio of $R_L$ to $X_L$. Expression (6) and Expression (7) as given below are computational expressions representing a process for determining the Q value.

$$Z_L = R_L + jX_L = \frac{V1}{I} = \frac{V1}{V2}Rs \quad \text{[Math. 6]}$$

$$Q = \frac{X_L}{R_L} \quad \text{[Math. 7]}$$

Also in the third embodiment where the Q value is determined in such a manner, it is possible to obtain the same advantageous effects as with the first and second embodiments by virtue of the function similar to that in the first and second embodiments. It is to be noted that the third embodiment is also applicable to both of the electric field coupling and the magnetic field coupling that are mentioned in the first embodiment.

4. Others

It is to be noted that, in the above-described first to third embodiments of the present disclosure, although a Q value at a resonant frequency is measured, a frequency at which the Q value is measured does not necessarily have to coincide with the resonant frequency provided that a slight deterioration in the detection sensitivity is allowable, and the Q value that is measured at a frequency shifted from the resonant frequency may be used.

Further, when a conductor such as a metal, or a circuit including a coil comes close to a primary-side coil or a secondary-side coil, although not only a Q value but also an L value (inductance value of coil) varies to cause a resonant frequency to be shifted, a state of the electromagnetic coupling may be detected by the combined use of a resonant frequency shift that is caused by variation in the L value as well as the Q value. In other words, a detecting section may perform detection concerning a state of the electromagnetic coupling with an external object by the combined use of the Q value in a resonant circuit and the L value in the resonant circuit.

Additionally, when a metallic object is interposed between a power transmitting coil and a power receiving coil, although a coupling factor k also varies, combined use of variations in a value of the coupling factor k and a Q value may be permitted for determination of a state of the electromagnetic coupling. In other words, a detecting section may perform detection concerning a state of the electromagnetic coupling with an external object by the combined use of the Q value in a resonant circuit and a value of the coupling factor k in the event of the electromagnetic coupling.

Furthermore, as the power transmitting coil and the power receiving coil according to the respective embodiments of the present disclosure, although the description is provided on an example of a coil having no core, any coil of a structure of being wound around a core having a magnetic material may be employed alternatively.

In addition, although a series of processes in the above-described respective embodiments of the present disclosure is executable in hardware, this is also executable in software. When such a series of processes is executed in software, this is executable using a computer (MPU and the like) in which any program configuring the software is built into a dedicated hardware, or a computer with installed programs for executing various functions.

What is more, processing steps describing time-series processes in the present specification include processes to be performed in parallel or individually (for example, parallel processing or object-oriented processing) even though they are not necessarily processed in chronological order, in addition to processes to be performed in a time-series manner in order of description as a matter of course.

It is to be noted that the present technology may be also configured as follows.

(1) A detector including
a detecting section determining a Q value or a degree of variation of the Q value in a circuit including a coil capable of electromagnetic coupling with an external object and performing detection concerning a state of the electromagnetic coupling with the external object based on a determined result.

(2) The detector according to (1), wherein the detecting section detects whether a conductor or another circuit including another coil is present in the vicinity of the coil as the state of the electromagnetic coupling with the external object.

(3) The detector according to (2), wherein when the presence of the conductor or the another circuit in the vicinity of the coil is detected, the detecting section further detects whether the detected object is one of the conductor and the another circuit.

(4) The detector according to (3), wherein the detecting section detects whether the detected object is one of the conductor or the another circuit based on a result of determining whether communication with the external object via the coil is possible.

(5) The detector according to (4), wherein the detecting section decides that the detected object is the another circuit when it is determined that the communication with the external object is possible, and decides that the detected object is the conductor when it is determined that the communication with the external object is not possible.

(6) The detector according to (4) or (5), further including a communication control section controlling the communication with the external object, wherein
when the presence of the conductor or the another circuit in the vicinity of the coil is detected, the detecting section instructs the communication control section to output a transmission signal to the detected object and determines whether the communication with the external object is possible depending on the presence or absence of a response to the transmission signal.

(7) The detector according to (6), wherein the detecting section determines that the communication with the external object is possible when there is a response to the transmission signal, and determines that the communication with the external object is not possible when there is no response to the transmission signal.

(8) The detector according to any one of (1) to (7), wherein the detecting section includes:
an arithmetic processing section calculating the Q value or a degree of variation of the Q value; and
a determination section determining a state of the electromagnetic coupling with the external object by comparing the Q value or a degree of variation of the Q value that is calculated by the arithmetic processing section with a predetermined threshold.

(9) The detector according to (8), wherein the circuit is a resonant circuit including the coil and a capacitor, and
the arithmetic processing section calculates the Q value in the resonant circuit from a ratio of a first voltage that is a voltage between the coil and the capacitor in the resonant circuit to a second voltage that is a voltage across the coil in the resonant circuit.

(10) The detector according to (8), wherein the circuit is a resonant circuit including the coil and a capacitor, and
the arithmetic processing section calculates the Q value in the resonant circuit by using a half-value width method in the resonant circuit.

(11) The detector according to (10), wherein the resonant circuit is a series resonant circuit, and the arithmetic processing section calculates the Q value in the series resonant circuit using the half-value width method based on a resonant frequency in the series resonant circuit and a bandwidth frequency at which impedance of 2 times as much as an absolute value for impedance at the resonant frequency is achieved.

(12) The detector according to (10), wherein the resonant circuit is a parallel resonant circuit, and the arithmetic processing section calculates the Q value in the parallel resonant circuit using the half-value width method based on a resonant frequency in the parallel resonant circuit and a bandwidth frequency at which impedance of ($\frac{1}{2}$) times as much as an absolute value for impedance at the resonant frequency is achieved.

(13) The detector according to (8), wherein the circuit is a resonant circuit including the coil and a capacitor, and the arithmetic processing section determines a real part component and an imaginary part component of impedance in the resonant circuit using an automatic balanced bridge circuit and a vector ratio detector, and calculates the Q value in the resonant circuit from a ratio of the real part component to the imaginary part component.

(14) The detector according to any one of (8) to (13), wherein the threshold corresponds to a Q value in the circuit under a condition that the conductor and the another circuit are not present in the vicinity of the coil.

(15) The detector according to any one of (1) to (14), wherein the detecting section performs detection concerning a state of the electromagnetic coupling with the external object by the combined use of the Q value in the circuit and one of an L value in the circuit and a value of a coupling factor k in the event of the electromagnetic coupling.

(16) A power transmitter, including:

a power transmitting coil capable of electromagnetic coupling with an external object;

a power transmitting section performing power transmission using the power transmitting coil; and a detecting section determining a Q value or a degree of variation of the Q value in a circuit including the power transmitting coil and performing detection concerning a state of the electromagnetic coupling with the external object based on a determined result.

(17) A power receiver, including:

a power receiving coil capable of electromagnetic coupling with an external object;

a power receiving section performing power reception using the power receiving coil; and a detecting section determining a Q value or a degree of variation of the Q value in a circuit including the power receiving coil and performing detection concerning a state of the electromagnetic coupling with the external object based on a determined result.

(18) A power feed system, including:

one or a plurality of power receivers; and one or a plurality of power transmitters performing power transmission utilizing the electromagnetic coupling for the power receivers, wherein the power transmitter has a power transmitting coil capable of electromagnetic coupling with an external object, and a power transmitting section performing power transmission using the power transmitting coil, the power receiver has a power receiving coil capable of electromagnetic coupling with an external object, and a power receiving section performing power reception using the power receiving coil, and a detecting section determining a Q value or a degree of variation of the Q value in a circuit including one of the power transmitting coil and the power receiving coil and performing detection concerning a state of the electromagnetic coupling with the external object based on a determined result is provided one or both of the power transmitter and the power receiver.

(19) The power feed system according to (18), wherein the detecting section is provided in the power receiver.

(20) A detection method, including:

a first step of determining a Q value or a degree of variation of the Q value in a circuit including a coil capable of electromagnetic coupling with an external object; and a second step of performing detection concerning a state of the electromagnetic coupling with the external object based on a result determined in the first step.

The present disclosure is not limited to the above-described respective embodiments, but any other various modification examples and application examples are available as a matter of course insofar as they are within the scope of the appended claims or the equivalents thereof.

The present application contains subject matter related to that disclosed in Japanese Priority Patent Application JP 2011-081018 filed in the Japan Patent Office on Mar. 31, 2011, the entire content of which is hereby incorporated by reference.

The invention claimed is:

1. A detector, comprising:
detection circuitry configured to:
send a signal to an external object,
receive a response to the signal,
determine whether communication with the external object is possible, based on whether the response to the signal is received,
determine, in respective ones of a first case where communication with the external object is possible and a second case where nothing is present in the vicinity of the resonance circuit, a Q-value of a resonance circuit including a coil, or a degree of variation of the Q-value of the resonance circuit, the Q-value being based on a voltage or an impedance, and
determine whether a foreign object is present in a vicinity of the coil, based on the determination of the Q-value or degree of variation of the Q-value.

2. The detector according to claim 1, wherein the resonance circuit further comprises a capacitor electrically connected with the coil in series, and the Q-value is a ratio of a first voltage across the coil to a second voltage across the coil and the capacitor.

3. The detector according to claim 1, the detection circuitry comprising an arithmetic processing section configured to calculate the Q-value, and output a calculation result.

4. The detector according to claim 1, the detection circuitry comprising a rectifier configured to convert an alternating current signal from the resonance circuit to a direct current signal.

5. The detector according to claim 1, the detection circuitry comprising an analog-to-digital converter configured to convert an analog signal from the resonance circuit to a digital signal.

6. The detector according to claim 1, wherein the detection circuitry is configured to determine whether the foreign object is present by comparing the Q-value or the degree of variation of the Q-value to a predetermined value.

7. The detector according to claim 6, wherein the predetermined value is a threshold that corresponds to a reference Q-value.

8. The detector according to claim 1, wherein the detection circuitry is configured to selectively allow a power transmission between the resonance circuit and the external object.

9. The detector according to claim 1, wherein the detection circuitry is configured to:
compare the Q-value or the degree of variation of the Q-value to a predetermined value; and
based on a result of the comparison, allow the power transmission between the resonance circuit and the external object.

10. The detector according to claim 1, wherein the detection circuitry is configured to:
compare the Q-value or the degree of variation of the Q-value to a predetermined value; and
based on a result of the comparison, not allow the power transmission between the resonance circuit and the external object.

11. A power transmission device, comprising:
a resonance circuit including a coil; and
detection circuitry configured to:
send a signal to an external object,
receive a response to the signal,
determine whether communication with the external object is possible, based on whether the response to the signal is received,
determine, in respective ones a first case where communication with the external object is possible and in a second case where nothing is present in the vicinity of the resonance circuit, a Q-value of the resonance circuit, or a degree of variation of the Q-value of the resonance circuit, the Q-value being based on a voltage or an impedance,
determine whether a foreign object is present in a vicinity of the coil, based on the determination of the Q-value or degree of variation of the Q-value.

12. The power transmission device according to claim 11, wherein the resonance circuit further comprises a capacitor electrically connected with the coil in series, and the Q-value is a ratio of a first voltage across the coil to a second voltage across the coil and the capacitor.

13. The power transmission device according to claim 11, further comprising an arithmetic processing section configured to calculate the Q-value, and output a calculation result to the detection circuitry.

14. The power transmission device according to claim 11, further comprising a rectifier configured to convert an alternating current signal from the resonance circuit to a direct current signal.

15. The power transmission device according to claim 11, further comprising an analog-to-digital converter configured to convert an analog signal from the resonance circuit to a digital signal.

16. The power transmission device according to claim 11, wherein the detection circuitry is configured to determine whether the foreign object is present by comparing the Q-value or the degree of variation of the Q-value to a predetermined threshold Q-value.

17. The power transmission device according to claim 16, wherein the predetermined threshold Q-value corresponds to a Q-value in a case where the object is not present.

18. The power transmission device according to claim 11, wherein the detection circuitry is configured to selectively allow a power transmission between the resonance circuit and the external object.

19. The power transmission device according to claim 18, wherein the detection circuitry is configured to, in a case where the communication is possible, allow the power transmission between the resonance circuit the external object.

20. The power transmission device according to claim 18, wherein the detection circuitry is configured to, in a case where the communication is not possible, prevent the power transmission between the resonance circuit and the external object.

21. A detector, comprising:
detection circuitry configured to:
send a signal to an external object,
receive a response to the signal,
determine whether communication with the external object is possible, based on whether the response to the signal is received,
determine, in respective ones of a first case where communication with the external object is possible and a second case where nothing is present in the vicinity of the resonance circuit, a Q-value of a resonance circuit including a coil, or a degree of variation of the Q-value of the resonance circuit, the Q-value being based on a voltage or an impedance,
compare the Q-value or the degree of variation of the Q-value to a predetermined value,
determine whether a foreign object is present in a vicinity of the coil, based on a result of the comparison, and
based on the result of the comparison, determine whether to allow the power transmission between the resonance circuit and the external object.

* * * * *